US009171835B2

(12) United States Patent
Jeong et al.

(10) Patent No.: US 9,171,835 B2
(45) Date of Patent: Oct. 27, 2015

(54) SEMICONDUCTOR APPARATUS INCLUDING DUMMY PATTERNS

(71) Applicant: SK hynix Inc., Icheon-si Gyeonggi-do (KR)

(72) Inventors: Jae Hong Jeong, Icheon-si (KR); Yun Suk Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 14/246,676

(22) Filed: Apr. 7, 2014

(65) Prior Publication Data

US 2015/0155274 A1    Jun. 4, 2015

(30) Foreign Application Priority Data

Dec. 2, 2013 (KR) .......................... 10-2013-0148465

(51) Int. Cl.
*H01L 27/00* (2006.01)
*H01L 27/02* (2006.01)
*H01L 27/092* (2006.01)

(52) U.S. Cl.
CPC ........ *H01L 27/0288* (2013.01); *H01L 27/0207* (2013.01); *H01L 27/0255* (2013.01); *H01L 27/092* (2013.01)

(58) Field of Classification Search
CPC .............. H01L 27/092; H01L 27/0255; H01L 27/0207

USPC .................................................. 257/358, 360
See application file for complete search history.

(56) References Cited

U.S. PATENT DOCUMENTS

| 7,205,611 | B2 * | 4/2007 | Honjoh et al. ................ 257/355 |
| 7,242,561 | B2 * | 7/2007 | Ker et al. ......................... 361/56 |
| 7,515,390 | B2 * | 4/2009 | Wang .............................. 361/56 |
| 7,532,446 | B2 * | 5/2009 | Cheng et al. ..................... 361/56 |
| 7,593,201 | B2 * | 9/2009 | Ishizuka et al. ................. 361/56 |
| 7,755,870 | B2 * | 7/2010 | Arai et al. ........................ 361/56 |
| 7,808,047 | B1 * | 10/2010 | Gallerano et al. ............ 257/355 |
| 7,816,761 | B2 * | 10/2010 | Egawa et al. ................ 257/529 |
| 2001/0033004 | A1 * | 10/2001 | Lin et al. ....................... 257/360 |
| 2008/0211029 | A1 * | 9/2008 | Yoshizumi et al. .......... 257/360 |
| 2010/0265622 | A1 * | 10/2010 | Campi et al. .................... 361/56 |
| 2011/0121394 | A1 * | 5/2011 | Su et al. ........................ 257/360 |

FOREIGN PATENT DOCUMENTS

KR    1020060006382 A    1/2006

* cited by examiner

*Primary Examiner* — Nathan Ha
(74) *Attorney, Agent, or Firm* — William Park & Associates Ltd.

(57) ABSTRACT

A semiconductor apparatus and system including a semiconductor apparatus may include: a main pattern block having a plurality of main patterns formed to be coupled to a power source and one or more dummy pattern blocks formed around the main pattern block. Any one of the one or more dummy pattern blocks may include a protection part formed to protect the main pattern block.

21 Claims, 8 Drawing Sheets

SEMICONDUCTOR APPARATUS INCLUDING DUMMY PATTERNS

CROSS-REFERENCES TO RELATED APPLICATION

The present application claims priority under 35 U.S.C. §119(a) to Korean application number 10-2013-0148465, filed on Dec. 2, 2013, in the Korean Intellectual Property Office, which is incorporated herein by reference in its entirety.

TECHNICAL FIELD

Various embodiments relate to a semiconductor apparatus, and more particularly, to a semiconductor apparatus using dummy patterns are set forth herein.

BACKGROUND

Recently, as designed to better meet the demand for higher integration and high-speed operation of semiconductors and semiconductor related products, the dimensions of a given transistor forming a unit cell in a semiconductor memory apparatus have been reduced.

According to such a trend, the gate length of a transistor has been shortened. To better accommodate shorter gate lengths, the gate of the transistor may be directly coupled to a power supply voltage VDD or ground voltage VSS in some cases.

As discussed here, when the power supply voltage VDD or ground voltage VSS is directly coupled to the gate of the transistor, a gate oxide may be broken by power noise. In such an event, the overall reliability of the semiconductor memory apparatus may be degraded and/or compromised.

SUMMARY

Various embodiments are directed to a semiconductor apparatus that protects a main pattern using one or more dummy patterns formed around the main pattern when the main pattern is coupled to a power source to thereby improve overall reliability.

According to an embodiment, a semiconductor apparatus may include: a main pattern block having a plurality of main patterns. The main patterns may be formed in a manner to be coupled to a power source. Further, one or more dummy pattern blocks may be formed around the main pattern block. Any one of the one or more dummy pattern blocks may include a protection part formed to protect the main pattern block.

According to another embodiment of the present invention, a semiconductor apparatus may include: a main pattern block including a plurality of transistors, and a dummy pattern block formed around the main pattern block. One or more transistors from among the plurality of transistors of the main pattern block may be coupled to a first metal line directly coupled to a power supply voltage. Alternatively, one or more transistors, as so described here, may be coupled to a second metal line directly coupled to a ground voltage, and the dummy pattern block may include one or more of a third metal line coupled to the main pattern block, a fourth metal line coupled to the first metal line, and a fifth metal line coupled to the second metal line.

According to yet another embodiment of the present invention, a system including a semiconductor apparatus is provided. The system may include: a main pattern block comprising a main pattern. The main pattern may be formed to couple to a power source. Further, the main pattern block may comprise a PMOS transistor and an NMOS transistor. The system may also include a dummy pattern block formed around the main pattern block, wherein the dummy pattern block has a protection part formed to protect the main pattern block.

DETAILED DESCRIPTION

A semiconductor apparatus using dummy patterns will be described below with reference to the accompanying drawings through embodiments.

Figure 1:
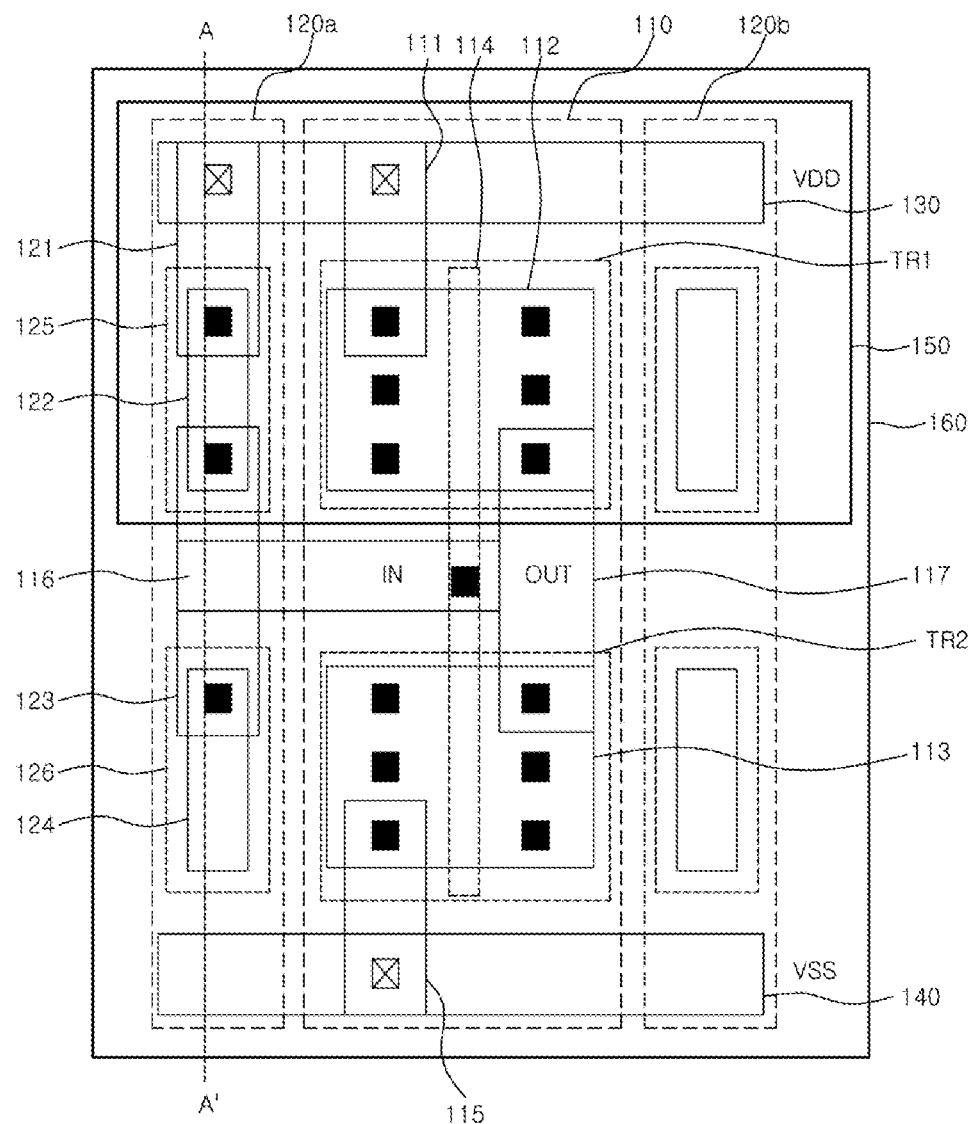
FIG. 1 is a layout diagram of a semiconductor apparatus according to an embodiment showing the semiconductor apparatus as designed to reduce noise of a power supply voltage.

Referring to FIG. 1, a semiconductor apparatus according to an embodiment, or a system including a semiconductor apparatus, may include a main pattern block 110 and dummy pattern blocks 120a and 120b. The dummy pattern blocks 120a and 120b may include a protection part formed to protect the main pattern block. Suitable protection parts may include, for example, a resistor, transistor and/or a diode coupled to a power supply voltage and/or to a ground voltage, in various combinations.

The main pattern block 110 is a block where main cells (not shown in FIG. 1) used to store data are formed, and may include one or more active regions 112 and 113 and a gate region 114 crossing the one or more active regions 112 and 113. More specifically, an N-well 150 may be formed in a designated region within a P-type substrate 160, the P+ active region 112 and the gate region 114 formed in the N-well 150 may serve as a PMOS transistor TR1, and the N+ active region 113 and the gate region 114 formed in a part of the P-type substrate 160 where the N-well 150 is not formed may serve as an NMOS transistor TR2. Further, the main pattern block 110 may include a third metal line 111 for directly coupling a first metal line 130 coupled to the power supply voltage VDD to the PMOS transistor TR1. The main pattern block 110 may also include a fourth metal line 115 for directly coupling a second metal line 140 coupled to the ground voltage VSS to the NMOS transistor TR2, a fifth metal line 116 coupled to the dummy pattern block 120a, and a sixth metal line 117 for coupling the P+ active region 112 and the N+ active region 113 and outputting a signal to the outside.

The dummy pattern blocks 120a and 120b may include a first dummy pattern block 120a formed in the left side of the main pattern block 110 and a second dummy pattern block 120b formed in the right side of the main pattern block 110.

Figure 2:
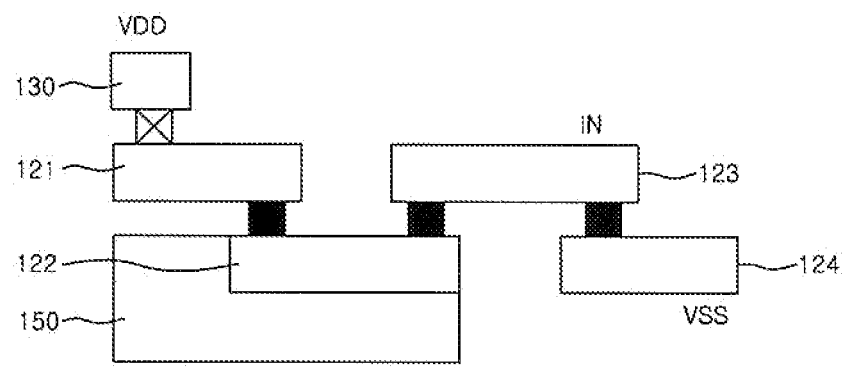
FIG. 2 is a cross-sectional view taken along A-A' of FIG. 1.

Referring to FIG. 2, the first dummy pattern block 120a (as shown in FIG. 1) may include a first dummy gate region 125 (as shown in FIG. 1) and a second dummy gate region 126 (as shown in FIG. 1). The first dummy gate region 125 may be formed to surround the dummy P+ active region 122 which is formed in the N-well 150. Likewise, the second dummy gate region 126 may be formed to surround a dummy N+ active region 124 which is formed in the part of the P-type substrate 160 where the N-well 150 is not formed. The first dummy pattern block 120a may further include a seventh metal line 121 and an eighth metal line 123. The seventh metal line 121 may be coupled to the first metal line 130 coupled to the power supply voltage VDD. The eighth metal line 123 may couple the dummy P+ active region 122 and the dummy N+ active region 126.

Figure 3:
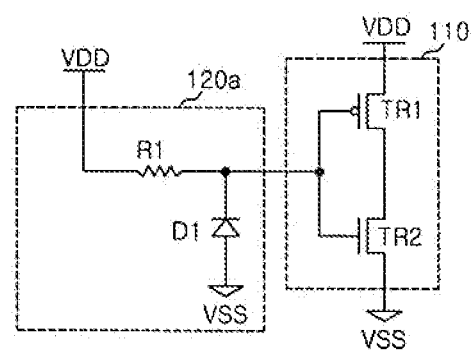
FIG. 3 is a circuit diagram illustrating a part of the configuration of FIG. 1.

Referring to FIG. 3 which is a circuit diagram of the first dummy pattern block 120a, the first dummy pattern block 120a may include a resistor R1 and a diode D1. As the patterns of the first dummy pattern block 120a are used to form the resistor R1 and the diode D1, the area may not be increased. The seventh and eighth metal lines 121 and 123 may be used concurrently to form another power transmission path where it is possible to reduce noise. Such noise may be caused by the power supply voltage VDD of the main pattern block 110 due to the coupling to the power supply voltage VDD.

The second dummy pattern block 120b may include dummy cells (not illustrated) which are not used for storing data.

Figure 4:
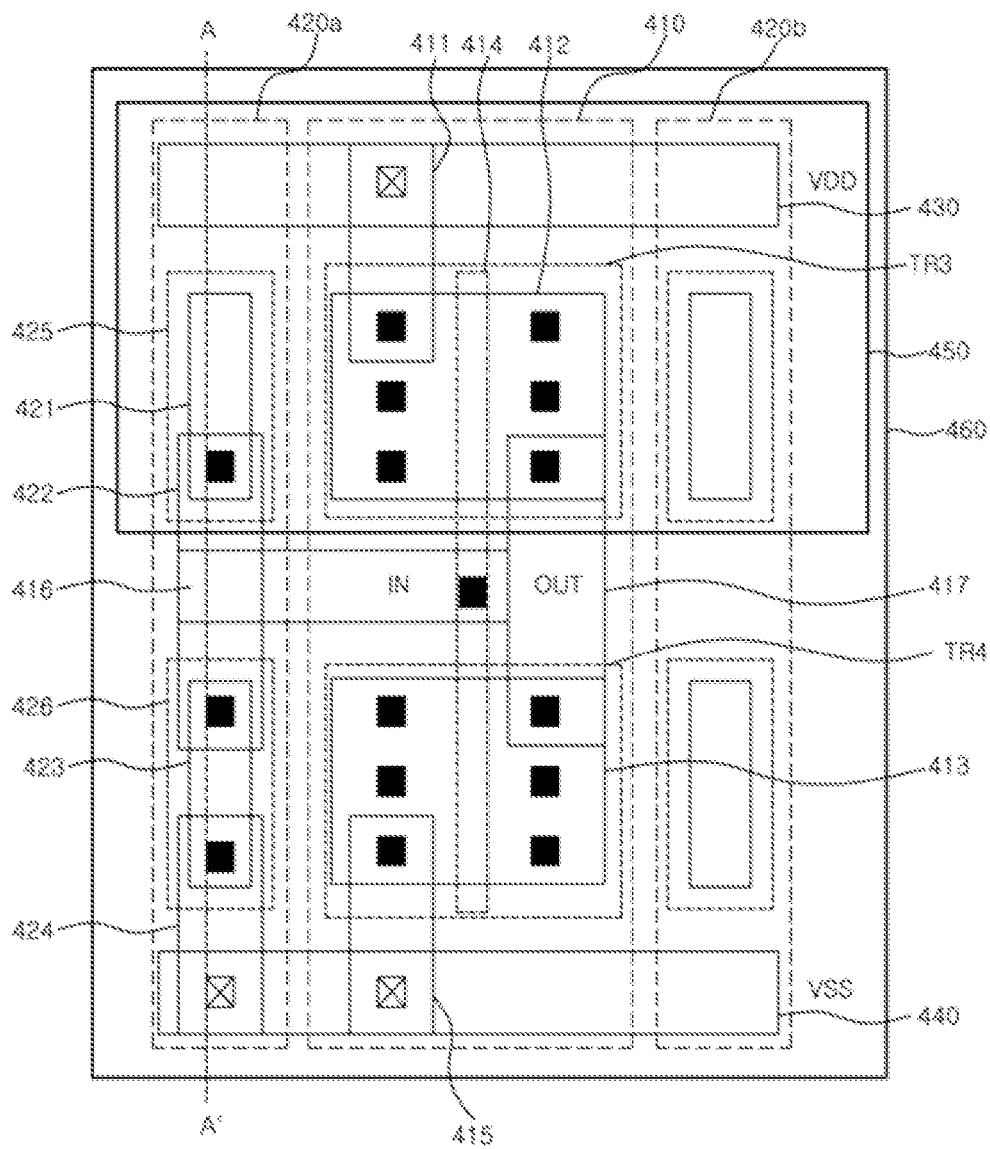
FIG. 4 is a layout diagram of a semiconductor apparatus according to an embodiment showing the semiconductor apparatus as designed to reduce noise of a ground voltage.

Referring to FIG. 4, a semiconductor apparatus, or a system including a semiconductor apparatus, according to an embodiment of the present invention may include a main pattern block 410 and dummy pattern blocks 420a and 420b. The dummy pattern blocks 420a and 420b may include a protection part formed to protect the main pattern block. Suitable protection parts may include, for example, a resistor, transistor and/or a diode coupled to a power supply voltage and/or to a ground voltage, in various combinations.

The main pattern block 410 is a block where main cells (not illustrated) used for storing data are formed, and may include one or more active regions 412 and 413 and a gate region 414 crossing the one or more active regions 412 and 413. More specifically, an N-well 450 may be formed in a designated region within a P-type substrate 460, and the P+ active region 412 and the gate region 414 formed in the N-well 450 may serve as a PMOS transistor TR3. The N+ active region 413 and the gate region 414 formed in a part of the P-type substrate 460 where the N-well 450 is not formed may serve as an NMOS transistor TR4. Further, the main pattern block 410 may further include a third metal line 411 for directly coupling a first metal line 430 coupled to a power supply voltage VDD to the PMOS transistor TR3, and a fourth metal line 415 for directly coupling a second metal line 440 coupled to a ground voltage VSS to the NMOS transistor TR4. The main pattern block 410 may also include a fifth metal line 416 coupled to the dummy pattern block 420a, and a sixth metal line 417 for coupling the P+ active region 412 and the N+ active region 413 and outputting a signal to the outside.

The dummy pattern blocks 420a and 420b may include a first dummy pattern block 420a formed in the left side of the main pattern block 410 and a second dummy pattern block 420b formed in the right side of the main pattern block 410.

Figure 5:
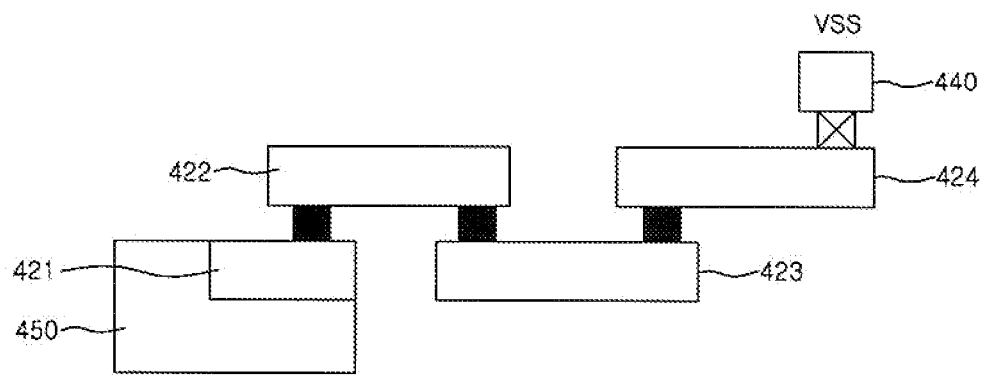
FIG. 5 is a cross-sectional view taken along A-A' of FIG. 4.
Figure 6:
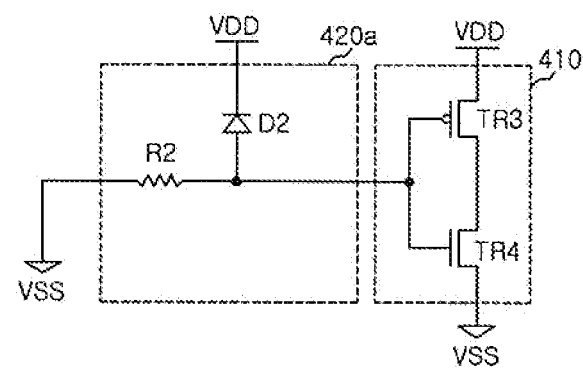
FIG. 6 is a circuit diagram illustrating a part of the configuration of FIG. 4.

Referring to FIG. 5, the first dummy pattern block 420a (as shown in FIG. 4) may include a first dummy gate region 425 (as shown in FIG. 4) and a second dummy gate region 426 (as shown in FIG. 4). The first dummy gate region 425 may be formed to surround a dummy P+ active region 421 which is formed in the N-well 450. Likewise, and the second dummy gate region 426 may be formed to surround the dummy N+ active region 423 which is formed in the part of the P-type substrate 460 where the N-well 450 is not formed. The first dummy pattern block 420a may further include a seventh metal line 422 and an eighth metal line 424. The seventh metal line 422 may couple the dummy P+ active region 421 and the dummy N+ active region 423, and the eighth metal line 424 may be coupled to the second metal line 440 coupled to the ground voltage VSS. Referring to FIG. 6 which is a circuit diagram of the first dummy pattern block 420a, the first dummy pattern block 420a may include a resistor R2 and a diode D2. As the patterns of the first dummy pattern block 420a are used to form the resistor R2 and the diode D2, the area may not be increased. The seventh and eighth metal lines 422 and 424 may be used concurrently to form another power transmission path where it is possible to reduce noise. Such noise may be caused by the ground voltage VSS of the main pattern block 410 due to the direct coupling to the ground voltage VSS.

The second dummy pattern block 420b (as shown in FIG. 4) may include dummy cells (not illustrated) which are not used for storing data.

Figure 7:
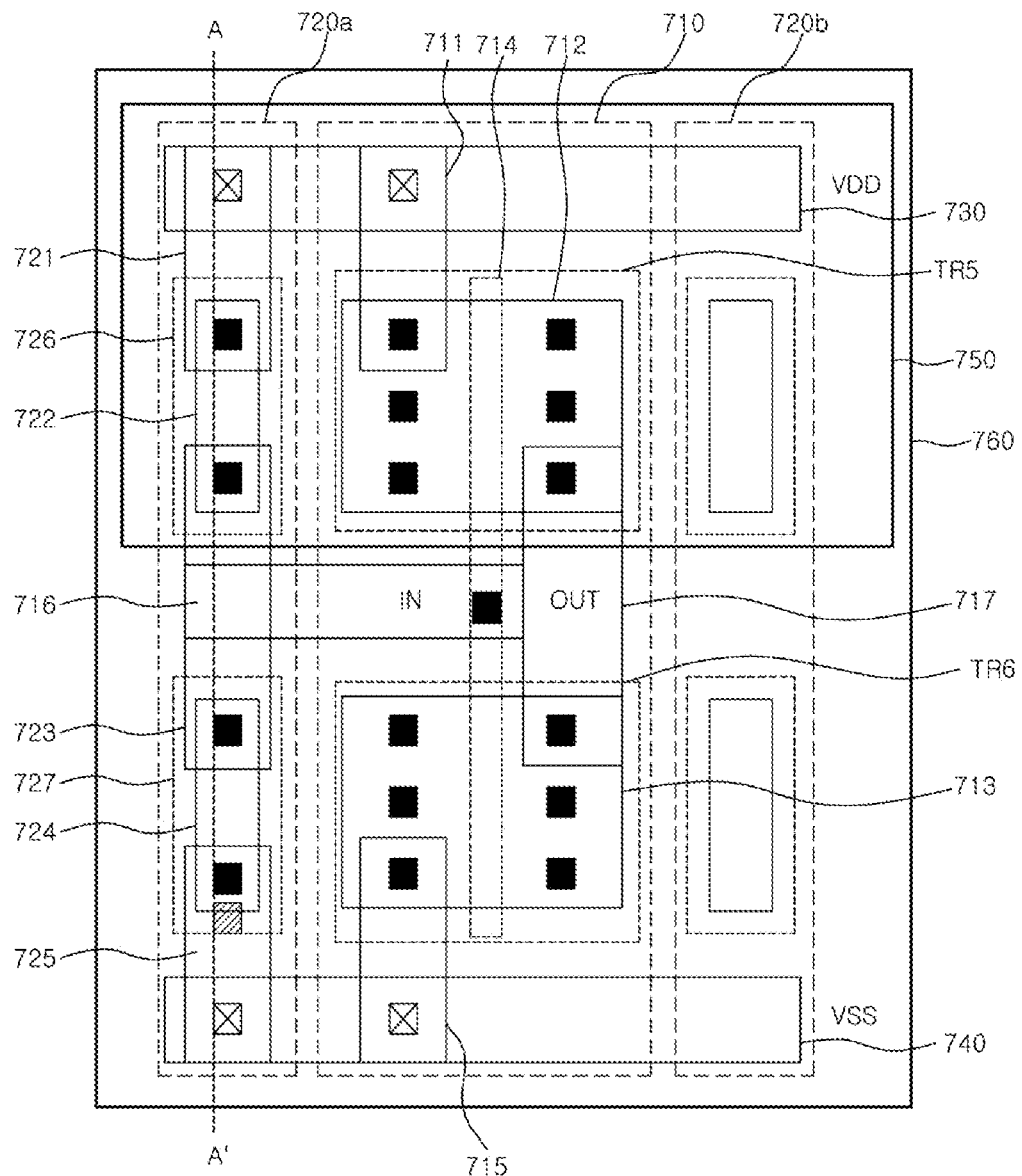
FIG. 7 is a layout diagram of a semiconductor apparatus according to another embodiment, when the semiconductor apparatus is designed to reduce noise of a power supply voltage.

Referring to FIG. 7, a semiconductor apparatus, or a system including a semiconductor apparatus, according to an embodiment may include a main pattern block 710 and dummy pattern blocks 720a and 720b. The dummy pattern blocks 720a and 720b may include a protection part formed to protect the main pattern block. Suitable protection parts may include, for example, a resistor, transistor and/or a diode coupled to a power supply voltage and/or to a ground voltage, in various combinations.

The main pattern block 710 is a block where main cells (not illustrated) used for storing data are formed, and may include one or more active regions 712 and 713 and a gate region 714 crossing the one or more active regions 712 and 713. More specifically, an N-well 750 may be formed in a designated region within a P-type substrate 760, the P+ active region 712 and the gate region 714 formed in the N-well 750 may serve as a PMOS transistor TR5. The N+ active region 713 and the gate region 714 formed in a part of the P-type substrate 760 where the N-well 750 is not formed may serve as an NMOS transistor TR6. Furthermore, the main pattern block 710 may include a third metal line 711 for electrically coupling a first metal line 730 coupled to the power supply voltage VDD to the PMOS transistor TR5, and a fourth metal line 715 for directly coupling a second metal line 740 coupled to the ground voltage VSS to the NMOS transistor TR5. The main pattern block 710 may also include a fifth metal line 716 coupled to the dummy pattern block 720a, and a sixth metal line 717 for coupling the P+ active region 712 and the N+ active region 713 and outputting a signal to the outside.

The dummy pattern blocks 720a and 720b may include a first dummy pattern block 720a formed in the left side of the main pattern block 710 and a second dummy pattern block 720b formed in the right side of the main pattern block 710.

Figure 8:
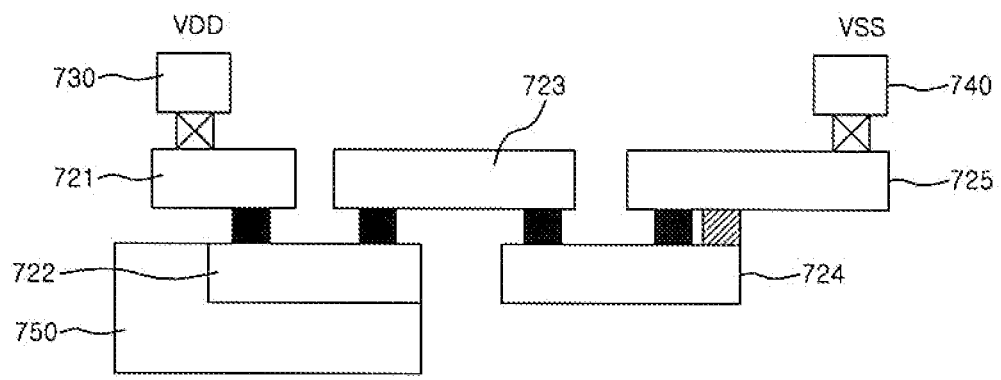
FIG. 8 is a cross-sectional view taken along A-A' of FIG. 7.

Referring to FIG. 8, the first dummy pattern block 720a (as shown in FIG. 7) may include a first dummy gate region 726

(as shown in FIG. 7) and a second dummy gate region 727 (as shown in FIG. 7). The first dummy gate region 726 may be formed to surround a dummy P+ active region 722 which is formed in the N-well 750. Likewise, the second dummy gate region 727 may be formed to surround the dummy N+ active region 724 which is formed in the part of the P-type substrate 760 where the N-well 750 is not formed. The first dummy pattern block 720a may further include a seventh metal line 721, an eighth metal line 723, and a ninth metal line 725. The seventh metal line 721 may be coupled to the first metal line 730 coupled to the power supply voltage VDD, the eighth metal line 723 may couple the dummy P+ active region 722 and the dummy N+ active region 724. The ninth metal line 725 may be coupled to the second metal line 740 coupled to the ground voltage VSS. The ninth metal line 725 may be contacted with the second dummy gate region 727 surrounding the dummy N+ active region 724, thereby forming one transistor.

Figure 9:
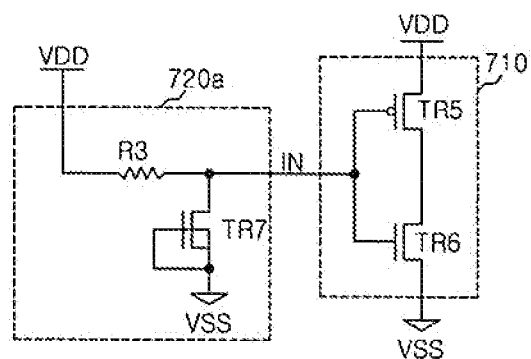
FIG. 9 is a circuit diagram illustrating a part of the configuration of FIG. 7.

Referring to FIG. 9 which is a circuit diagram of the first dummy pattern block 720a, the first dummy pattern block 720a may include a resistor R3 and a diode-type transistor TR7 operating as a diode. As the patterns of the first dummy pattern block 720a are used to form the resistor R3 and the diode-type transistor TR7, the area may not be increased. The seventh, eighth, and ninth metal lines 721, 723, and 725 are concurrently used to form another power transmission path, where it is possible to reduce noise. Such noise may be caused by the power supply voltage VDD of the main pattern block 710 due to the direct coupling to the power supply voltage VDD.

The second dummy pattern block 720b (as shown in FIG. 7) may include dummy cells (not illustrated) which are not used for storing data.

Figure 10:
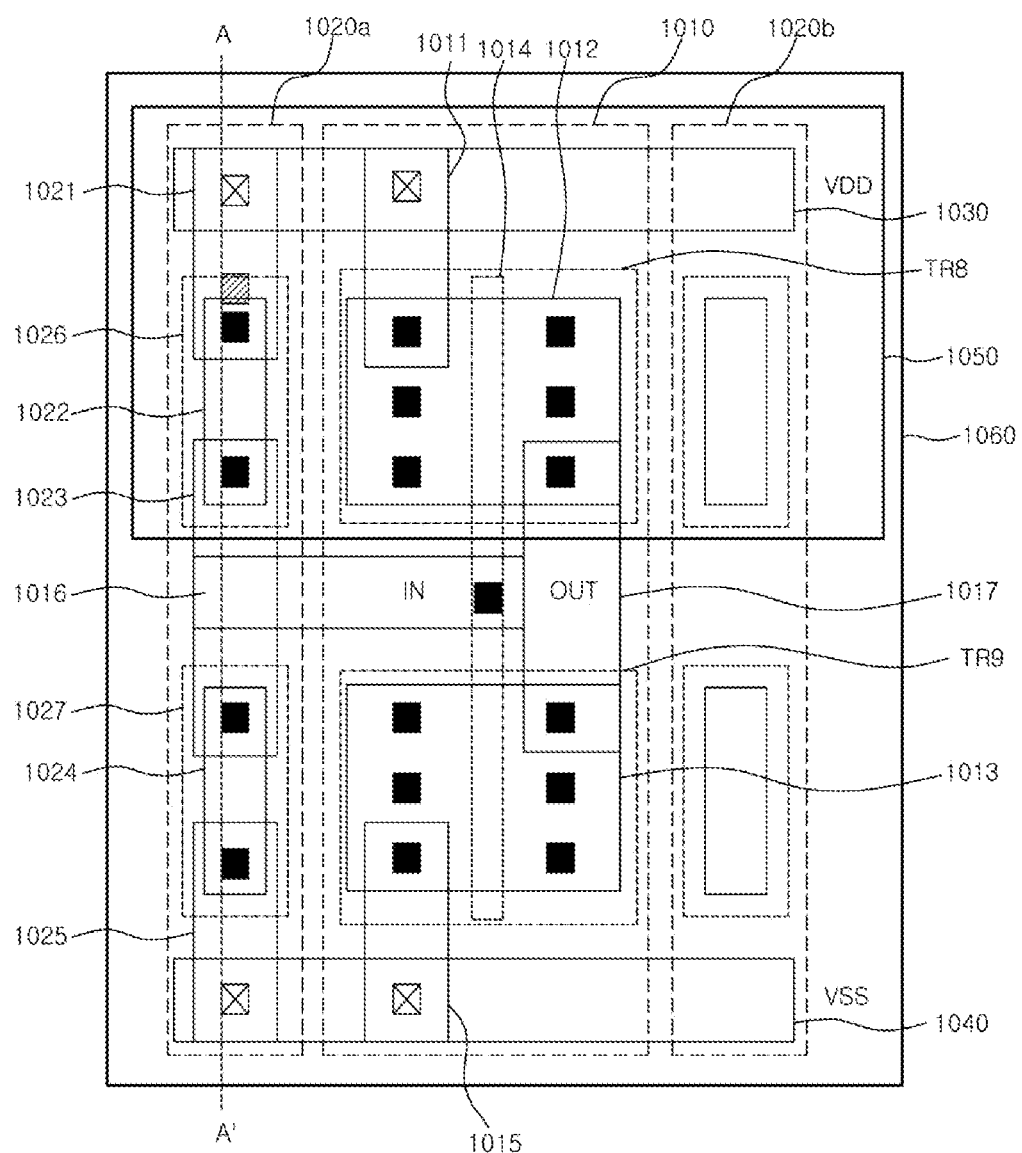
FIG. 10 is a layout diagram of a semiconductor apparatus according to another embodiment, showing the semiconductor apparatus as designed to reduce noise of a ground voltage.

Referring to FIG. 10, a semiconductor apparatus, or a system including a semiconductor apparatus, according to an embodiment of the present invention may include a main pattern block 1010 and dummy pattern blocks 1020a and 1020b. The dummy pattern blocks 1020a and 1020b may include a protection part formed to protect the main pattern block. Suitable protection parts may include, for example, a resistor, transistor and/or a diode coupled to a power supply voltage and/or to a ground voltage, in various combinations.

The main pattern block 1010 is a block where main cells (not illustrated) used for storing data are formed, and may include one or more active regions 1012 and 1013 and a gate region 1014 crossing the one or more active regions 1012 and 1013. More specifically, an N-well 1050 may be formed in a designated region within a P-type substrate 1060, the P+ active region 1012 and the gate region 1014 formed in the N-well 1050 may serve as a PMOS transistor TR8. The N+ active region 1013 and the gate region 1014 formed in a part of the P-type substrate 1060 where the N-well 1050 is not formed may serve as an NMOS transistor TR9. Furthermore, the main pattern block 1010 may further include a third metal line 1011 for directly coupling a first metal line 1030 coupled to a power supply voltage VDD to the PMOS transistor TR8, a fourth metal line 1015 for directly coupling a second metal line 1040 coupled to a ground voltage VSS to the NMOS transistor TR9. The main pattern block may also include a fifth metal line 1016 coupled to the dummy pattern block 1020a, and a sixth metal line 1017 for coupling the P+ active region 1012 and the N+ active region 1013 and outputting a signal to the outside.

The dummy pattern blocks 1020a and 1020b may include a first dummy pattern block 1020a formed in the left side of the main pattern block 1010 and a second dummy pattern block 1020b formed in the right side of the main pattern block 1010.

Figure 11:
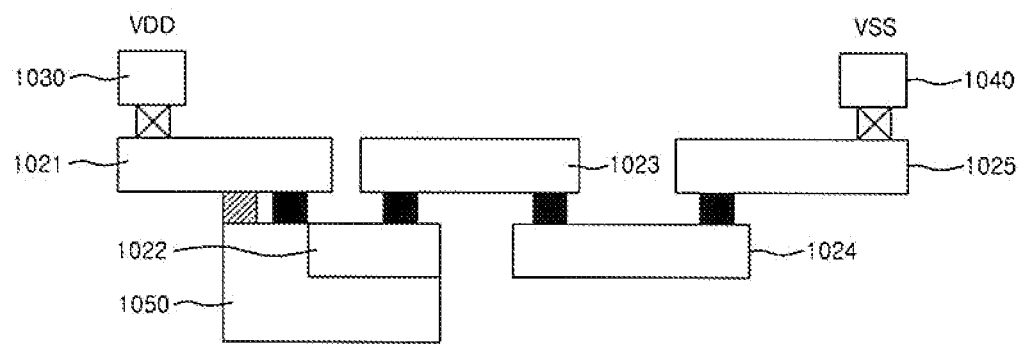
FIG. 11 is a cross-sectional view taken along A-A' of FIG. 10.

Referring to FIG. 11, the first dummy pattern block 1020a (as shown in FIG. 10) may include a first dummy gate region 1026 (as shown in FIG. 10) and a second dummy gate region 1027 (as shown in FIG. 10). The first dummy gate region 1026 may be formed to surround a dummy P+ active region 1022 which is formed in the N-well 1050. The second dummy gate region 1027 may be formed to surround a dummy N+ active region 1024 which is formed in the part of the P-type substrate 1060 where the N-well 1050 is not formed. The first dummy pattern block 1020a may further include a seventh metal line 1021, an eighth metal line 1023, and a ninth metal line 1025. The seventh metal line 1021 may be coupled to the first metal line 1030 coupled to the power supply voltage VDD and the dummy P+ active region 1022 of the first dummy pattern block 1020a. The eighth metal line 1023 may couple the dummy P+ active region 1022 and the dummy N+ active region 1024. The ninth metal line 1025 may be coupled to the second metal line 1040 coupled to the ground voltage VSS. The seventh metal line 1021 may be contacted with the first dummy gate region 1026 (as shown in FIG. 10) surrounding the dummy P+ active region 1022, thereby forming one transistor.

Figure 12:
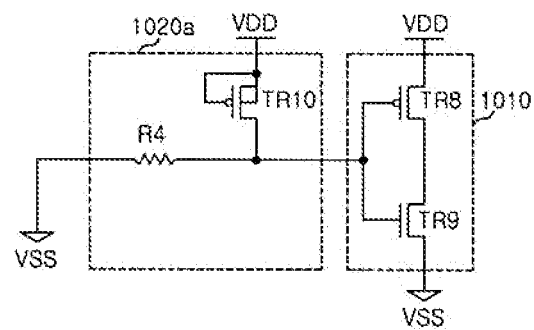
FIG. 12 is a circuit diagram illustrating a part of the configuration of FIG. 10.

Referring to FIG. 12 which is a circuit diagram of the first dummy pattern block 1020a, the first dummy pattern block 1020a may include a resistor R4 and a diode-type transistor TR10. As the patterns of the first dummy pattern block 1020a are used to form the resistor R4 and the diode-type transistor TR10, the area may not be increased. The seventh, eighth, and ninth metal lines 1021, 1023, and 1025 are concurrently used to form another power transmission path where it is possible to reduce noise which may be caused by the ground voltage VSS of the main pattern block 1010 due to the direct coupling to the ground voltage VSS.

The second dummy pattern block 1020b may include dummy cells (not illustrated) which are not used for storing data.

It should be understood that various changes and modifications to the presented embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A semiconductor apparatus comprising:
   a main pattern block comprising a main pattern wherein the main pattern is formed to couple to a power source; and
   a dummy pattern block formed around the main pattern block,
   wherein the dummy pattern block has a protection part formed to protect the main pattern block,
   the protection part includes a dummy active region, a first metal line coupled between the power source and the dummy active region, and a second metal line coupled between the dummy active region and the main pattern, and
   the power source is transferred to the main pattern block through the first metal line and the second metal line.

2. The semiconductor apparatus according to claim 1, wherein the main pattern block comprises a PMOS transistor and an NMOS transistor.

3. The semiconductor apparatus according to claim 1, wherein a resistor coupled to a power supply voltage and a diode coupled to a ground voltage are formed in the protection part by integrating the dummy active region, the first metal line and the second metal line.

4. The semiconductor apparatus according to claim 1, wherein a diode coupled to a power supply voltage and a resistor coupled to a ground voltage are formed in the protection part by integrating the dummy active region, the first metal line and the second metal line.

5. The semiconductor apparatus according to claim 1, wherein a resistor coupled to a power supply voltage and a transistor coupled to a ground voltage are formed in the protection part by integrating the dummy active region, the first metal line and the second metal line.

6. The semiconductor apparatus according to claim 1, wherein a transistor coupled to a power supply voltage and a resistor coupled to a ground voltage are formed in the protection part by integrating the dummy active region, the first metal line and the second metal line.

7. A semiconductor apparatus comprising:
a main pattern block comprising a plurality of transistors; and
a dummy pattern block formed around the main pattern block,
wherein one or more transistors among the plurality of transistors of the main pattern block are coupled to a first metal line coupled to a power supply voltage or a second metal line coupled to a ground voltage, and
the dummy pattern block comprises one or more of a third metal line coupled to the main pattern block, a fourth metal line coupled to the first metal line, and a fifth metal line coupled to the second metal line.

8. The semiconductor apparatus according to claim 7, wherein the main pattern block further comprises:
a PMOS transistor comprising a P+ active region and a first gate line crossing the P+ active region;
an NMOS transistor comprising an N+ active region to which the first gate line is extended;
a sixth metal line coupling the first metal line and the PMOS transistor;
a seventh metal line coupling the second metal line and the NMOS transistor;
an input line coupling the main pattern block and the dummy pattern block; and
an output line coupling the P+ active region and the N+ active region and outputting a signal to the outside.

9. The semiconductor apparatus according to claim 8, wherein the dummy pattern block further comprises:
a dummy P+ active region surrounded by a first dummy gate region;
a dummy N+ active region surrounded by a second dummy gate region;
a fourth metal line coupling the dummy P+ active region and the first metal line; and
an eighth metal line coupling the dummy P+ active region and the dummy N+ active region.

10. The semiconductor apparatus according to claim 9, wherein the dummy pattern block comprises a resistor coupled to the power supply voltage and a diode coupled to the ground voltage.

11. The semiconductor apparatus according to claim 8, wherein the dummy pattern block comprises:
a dummy P+ active region surrounded by a first dummy gate region;
a dummy N+ active region surrounded by a second dummy gate region;
a fifth metal line coupling the dummy N+ active region and the second metal line; and
an eighth metal line coupling the dummy P+ active region and the dummy N+ active region.

12. The semiconductor apparatus according to claim 11, wherein the dummy pattern block comprises a diode coupled to the power supply voltage and a resistor coupled to the ground voltage.

13. The semiconductor apparatus according to claim 8, wherein the dummy pattern block comprises:
a dummy P+ active region surrounded by a first dummy gate region;
a dummy N+ active region surrounded by a second dummy gate region;
a fourth metal line coupling the dummy P+ active region and the first metal line;
an eighth metal line coupling the dummy P+ active region and the dummy N+ active region;
a fifth metal line coupling the dummy N+ active region and the second metal line, and
the fourth metal line is in contact with the first dummy gate region.

14. The semiconductor apparatus according to claim 13, wherein the dummy pattern block comprises a resistor coupled to the power supply voltage and a transistor coupled to the ground voltage.

15. The semiconductor apparatus according to claim 8, wherein the dummy pattern block comprises:
a dummy P+ active region surrounded by a first dummy gate region;
a dummy N+ active region surrounded by a second dummy gate region;
a fourth metal line coupling the dummy P+ active region and the first metal line;
an eighth metal line coupling the dummy P+ active region and the dummy N+ active region; and
a fifth metal line coupling the dummy N+ active region and the second metal line, wherein the fifth metal line is in contact with the second dummy gate.

16. The semiconductor apparatus according to claim 15, wherein the dummy pattern block comprises a transistor coupled to the power supply voltage and a resistor coupled to the ground voltage.

17. A semiconductor apparatus comprising:
a first conductive well including a first main pattern block and a first dummy pattern block;
a second conductive well opposite to the first conductive well, and including a second main pattern block electrically coupled to the first main pattern block and a second dummy pattern block electrically coupled to the first dummy pattern block; and
a plurality of interconnections configured to electrically couple a power source and the first and second main pattern blocks through the first and second dummy pattern blocks.

18. The semiconductor apparatus according to claim 17, wherein the plurality of interconnections include a first interconnection configured to electrically couple the power source and the first dummy pattern block, a second interconnection configured to electrically couple the first and second dummy pattern blocks, a third interconnection configured to electrically couple the second interconnection and the first and second main pattern blocks.

19. The semiconductor apparatus according to claim 18, wherein the power source is a power supply voltage.

20. The semiconductor apparatus according to claim 17, wherein the plurality of interconnections include a first interconnection configured to electrically couple the power source and the second dummy pattern block, a second interconnection configured to electrically couple the first and second dummy pattern blocks, a third interconnection configured to electrically couple the second interconnection and the first and second main pattern blocks.

21. The semiconductor apparatus according to claim 20, wherein the power source is a ground voltage.

* * * * *